United States Patent [19]

Hieber et al.

[11] Patent Number: 4,608,271
[45] Date of Patent: Aug. 26, 1986

[54] METHOD FOR THE MANUFACTURE OF METAL SILICIDE LAYERS BY MEANS OF REDUCED PRESSURE GAS PHASE DEPOSITION

[75] Inventors: Konrad Hieber, Bernau; Manfred Stolz, Munich; Claudia Wieczorek, Ottobrunn, all of Fed. Rep. of Germany

[73] Assignee: Siemens Aktiengesellschaft, Berlin & Munich, Fed. Rep. of Germany

[21] Appl. No.: 714,850

[22] Filed: Mar. 22, 1985

[30] Foreign Application Priority Data

Apr. 6, 1984 [DE] Fed. Rep. of Germany ....... 3413064

[51] Int. Cl.$^4$ .............................................. B05D 3/06
[52] U.S. Cl. ...................................... 427/38; 427/87; 427/95; 427/99; 427/124
[58] Field of Search ..................... 427/38, 87, 95, 99, 427/124

[56] References Cited

U.S. PATENT DOCUMENTS 4,359,490 11/1982 Lehrer .............................. 427/126.1

Primary Examiner—Bernard D. Pianalto
Attorney, Agent, or Firm—Hill, Van Santen, Steadman & Simpson

[57] ABSTRACT

A method for the deposition of a silicide layer of a high melting metal onto a substrate of silicon or silicon dioxide wherein reaction gases consisting of a decomposable silicon-containing hydrogen compound, or a halogenated silane and a metal halide are pyrolytically decomposed in a reaction zone to form a reaction mixture from which a metal silicide is deposited on the substrate at reduced pressures. During the decomposition of the gases and deposition of the metal silicide, the gas pressure in the reaction zone is maintained between $1.3 \times 10^{-3}$ to $5 \times 10^{-2}$ mbar. This type of pressure is most conveniently maintained by means of a turbomolecular pump.

9 Claims, 1 Drawing Figure

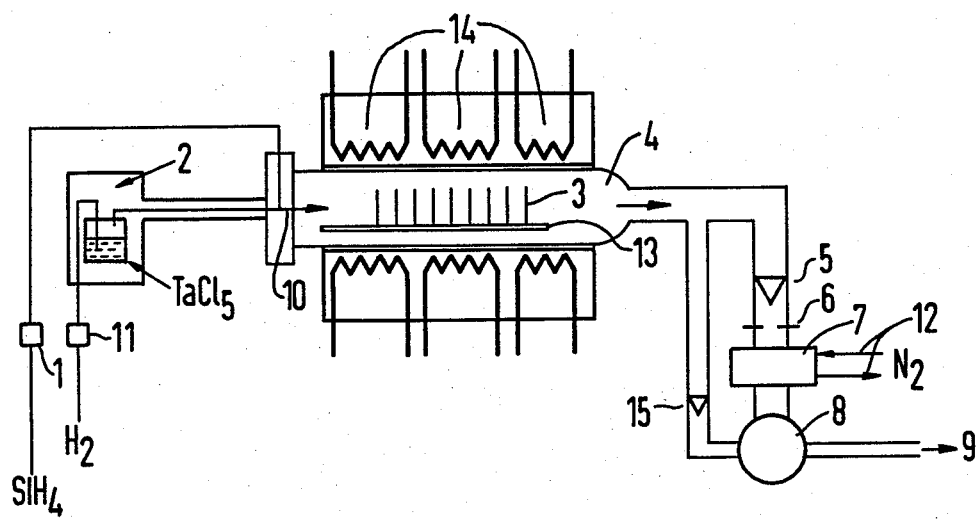

METHOD FOR THE MANUFACTURE OF METAL SILICIDE LAYERS BY MEANS OF REDUCED PRESSURE GAS PHASE DEPOSITION

BACKGROUND OF THE INVENTION

1. Field of the Invention

The present invention is in the field of manufacture of layers of silicides of high melting point metals onto substrates of silicon and/or silicon dioxide particularly employed in semiconductor technology for VLSI (very large scale integration)-circuits. The method involves thermal decomposition of silicon containing hydrogen compounds, or halogenated silanes, and metal halides and deposition of the resulting metal silicides from the gas phase at reduced pressure onto the substrate.

2. Description of the Prior Art

The deposition of tantalum silicide from a gaseous mixture at low pressures has been described in an article by Lehrer in the Proceedings of the 1st International Symposium on VLSI Science and Technology (1982), pages 258 to 264, as well as from U.S. Pat. No. 4,359,490.

The VLSI-Technology requires, in the manufacture of interconnect metallization planes, very small (one square micron or so) and deep (one micron) contact holes. With previously employed physical coating methods, such as evaporation or sputtering, the patterned substrate wafer can only be insufficiently coated at steps with the deposited silicides such as the disilicides of the metals titanium, tantalum, molybdenum, tungsten or cobalt. A good step coverage can only be obtained if the manufacture of the layer is accomplished by the proven method of chemical vapor deposition (CVD). To obtain a satisfactory step coverage in evaporation or sputtering equipments, substrate holders must be employed whereby the substrates in addition to being given a planetary motion, must also be given a tumbling motion in order that the steam jet will strike the substrates at angles of incidence which are as large as possible and which are different. These mechanical apparatus produce very small particles which lead to defects in the microstructured components. For this reason, a coating method having good step coverage is of great advantage. The CVD method is such a method since the material is deposited from the gas phase and a patterned substrate is uniformly coated.

In the known process of deposition of polycrystalline silicon according to the pyrolytic decomposition of silane:

$$SiH_4 \rightarrow Si + 2H_2 \qquad (1)$$

A reduction of the reaction pressure (starting with normal pressure) brings about a significant improvement regarding homogeneity in the layer thickness over the substrate surface even if the wafers are tightly packed (see K. F. Jensen, D. B. Graves, J. Electrochem. Soc., Vol. 130, No. 9 (1983), pages 1950 to 1957).

From the initially cited article of Lehrer, the following process parameters are known for the deposition of polycrystalline silicon:

A temperature of 615° to 635° C., a pressure of 0.3 Torr (approximately 0.39 mbar), and a silane quantity of 30 standard cc/min.

If it is desired to manufacture a low resistance metal silicide (for example, tantalum silicide) according to the process parameters used in the case of the deposition of polycrystalline silicon, through admixture, for example, of a metal halide such as tantalum chloride, difficulties arise regarding homogeneity in the layer thickness and material composition. The cause for this is a separation of the reaction gases (silane and tantalum chloride) due to the greatly different molecular weights, as well as the onset of secondary reactions such as, for example:

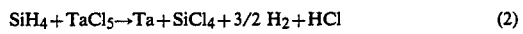

$$SiH_4 + TaCl_5 \rightarrow Ta + SiCl_4 + 3/2\ H_2 + HCl \qquad (2)$$

From the article by Lehrer, it is further known that the homogeneity in the layer thickness distribution and/or material composition of the tantalum silicon layers are very strongly dependent upon the reactor pressure and that the uniform coating of several silicon substrates with, for example, tantalum disilicide, apparently presents difficulties. If, simultaneously, for example, 25 pieces of 3-inch silicon wafers are to be coated, which substrates are covered with a native oxide layer of approximately 3 nm, the process according to Lehrer must be varied such that initially a silicon layer is deposited and, thereupon, a tantalum-rich silicide layer is produced according to the following gross reaction:

$$3\ SiH_4 + 5\ TaCl_5 + 13/2\ H_2 \rightarrow Ta_5Si_3 + 25\ HCl \qquad (3)$$

In order to obtain $TaSi_2$, this $Si/Ta_5Si_3$ double layer must be briefly annealed, for example, at 800° C. For the deposition of tantalum silicon, the following parameters have been expressed in the article of Lehrer:

A temperature of 615° to 635° C., a pressure of 0.28 Torr (approximately 0.37 mbar) a silane quantity of 24 sccm, a tantalum chloride temperature of 125° C., corresponding to a partial pressure of approximately 3 Torr (approximately 4 mbar) and a hydrogen rate of 5 sccm. The process proposed by Lehrer (hot wall reactor, pressure range: 0.2 to 0.3 Torr) implies a preheating of the reaction gases thus favoring the homogeneous nucleation of Ta in the gas phase according to equation 2. Further on hot parts of the quartz tube (about 620° C.) were coated with $Ta_5Si_3$ according to equation 3. A reason for the variation of the sheet resistance (about ±10%) and its strong dependence from the reaction pressure may be that the decomposition products produced by the above-mentioned reactions may not be removed quickly enough thus influencing the deposition at the substrate position.

In order to reduce the relative amount of decomposition products, taking into account lesser quantities per charge, it is possible as disclosed in an article by D. L. Brors et al in Solid State Technology (April 1983), pages 183 to 186, for the deposition of tungsten silicide, to introduce a cold wall reactor and additionally dilute the reaction mixture with an inert gas. This proceeds according to the gross reaction equation:

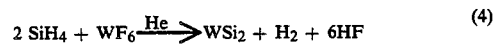

$$2\ SiH_4 + WF_6 \xrightarrow{He} WSi_2 + H_2 + 6HF \qquad (4)$$

This reaction is carried out at a temperature of 350° to 400° C. and at a pressure of 0.050 to 0.300 Torr (approximately 0.066 to 0.395 mbar).

Finally, it is known from an article by K. Akitmoto and K. Watanabe appearing in the Appl. Phys. Letters 39 (September 1981), pages 445 to 447, that the reaction of silane and tungsten fluoride can produce $W_xSi_{1-x}$ by chemical vapor deposition when enhanced with plasma (PECVD), the temperature amounting to 230° C., and the pressure being from 0.5 to 0.7 Torr (0.66 to 0.92 mbar).

The drawback of all the CVD-methods is that the homogeneity in relation to the layer thickness and material composition as well as the free selectability of layer compositions is not optimum in the case of manufacture of metal-silicon-alloy layers with a high throughput because either decomposition products increase in amount or the reactants become separated.

SUMMARY OF THE INVENTION

The present invention has as its objective the provision of a coating method for producing metal silicides, particularly tantalum disilicide in which these drawbacks do not occur and also provide a high throughput as well as a very good step coverage. Moreover, through the method of the present invention, in the case of conductor lines, no layer thickness reduction occurs at steps, whereby the yield of operable devices is substantially increased.

The improvements of the invention are achieved through a method of the type initially described in that, during the decomposition of the gases and the deposition of the metal silicides, the reaction gas pressure in the reaction zone is reduced to a range of between $1.3 \times 10^{-3}$ and $5 \times 10^{-2}$ mbar by means of a turbomolecular pump with a high suction power. Preferably, a reaction gas pressure of between $2 \times 10^{-3}$ and $4 \times 10^{-2}$ mbar is provided, which lies lower than in the case of the methods designated as low pressure CVD.

Compared with known methods of the LPCVD-technology (low pressure chemical vapor deposition) through utilization of a strongly reduced pressure (transition from the laminar to the molecular flow range) and possibly lower gas quantities, an improved intermixing of the gases as well as a more rapid removal and transport of the decomposition products even from small contact holes is provided. This is made possible through utilization of a turbomolecular pump having a high suction power. The turbomolecular pump must be protected against corrosion, for example, by rinsing of the bearings with an inert gas, and utilizing a corrosion-protected rotor. The pump is employed at high rpm even at pressures of $10^{-2}$ mbar.

It is also within the scope of the present invention that in the case of a reaction gas pressure in excess of $3 \times 10^{-2}$ mbar, in order to generate the necessary pressure gradient, a turbomolecular pump is employed whose connection to the reaction chamber is formed by means of a cross-sectional constriction or narrowing, such as provided by a throttle valve. In this manner, it is possible that given a reaction gas pressure in excess of approximately $3 \times 10^{-2}$ mbar, the turbomolecular pump itself is operated in a lower pressure range, for example $4 \times 10^{-2}$ mbar in the reaction chamber, and less than $1 \times 10^{-3}$ mbar in the turbomolecular pump.

The fact that given such a reduced pressure, i.e., low concentration, a deposition still takes place at all is not apparent since, with such a low supersaturation in the gas phase, difficulties can occur in the crystal nucleus formation such, for example, as is the case with the deposition of pure tantalum:

$$TaCl_5 + 5/2\ H_2 \rightarrow Ta + 5\ HCl \qquad (5)$$

If the reaction pressure is reduced, the crystal nucleus density strongly decreases, which results in layers with coarse grained microstructure. Such rough layers are not adequate protection against corrosion. If the decomposition temperature is reduced, as required for silicide deposition, to 650° C. or so, this effect is further increased.

The article by Lehrer also discloses that in the case of tantalum silicide deposition at approximately 620° C., during the transition of the pressure from 0.36 mbar to 0.26 mbar, the homogeneity regarding layer thickness and/or material composition becomes poorer.

In accordance with the present invention, during the pyrolytic decomposition of silane which also results in the deposition of silicon in the pressure range of $1.3 \times 10^{-3}$ to $5 \times 10^{-2}$ mbar, atomic hydrogen is released on the substrate surface which reduces metal halides such as $TaCl_5$, and $TaF_5$ with a very high yield. Due to this effective reaction, in spite of a lower metal halide partial pressure, a supersaturation of tantalum results directly above the substrate so that crystal nucleus formation results. With the same metal halide partial pressure and molecular hydrogen, the supersaturation necessary for crystal nucleus formation of, for example, tantalum in the boundary layer to the substrate surface will not be obtained as disclosed, for example, in an article by K. Hieber and M. Stolz appearing in the Siemens Forsch. und Entw. Ber. Vol. 6 (1977) 4, pages 232 to 235.

The technique of reducing the pressure during the decomposition to values between $1.3 \times 10^{-3}$ and $5 \times 10^{-2}$ mbar has the following advantages:

1. A good intermixture occurs between the reactants consisting of silane and, for example, tantalum pentachloride or tantalum pentafluoride, 2. A better control of the decomposition of the metal halide by the uniform pyrolytic decomposition of silane which results in a greater homogeneity regarding layer thickness and material composition.

Under the pressure conditions used in the present invention, the following unique gross reaction forms the basis of deposition of, for example, tantalum disilicide:

$$2\ SiH_4 + TaCl_5 \rightarrow TaSi_2 + 3/2\ H_2 + 5\ HCl \qquad (6)$$

The composition of the metal-silicon alloy film can be freely chosen on any substrate by variation of the composition of, for example, silane and tantalum chloride.

The present invention, while preferably applied to the deposition of tantalum silicide can be used for the manufacture of silicide layers of titanium, tungsten, molybdenum, or niobium, to serve as metallization layers for integrated semiconductor circuits. Such depositions make use of silane or halogenated silanes, for example, $SiH_xCl_{4-x}$ where x is an integer of 1 to 4. In the utilization of a silane which is halogenated to a greater degree such as silicochloroform ($SiHCl_3$), it can be seen that the atomic hydrogen which is liberated during the pyrolytic decomposition is not present to a sufficient extent for the reduction, for example, of tantalum pentachloride. In this case, according to an embodiment of the present invention, atomic hydrogen which, for example, is produced through plasma activation, is additionally added to the reaction gas mixture.

BRIEF DESCRIPTION OF THE DRAWING

The single Figure in the drawing illustrates a sample embodiment of the invention and schematically represents a sectional view of a horizontal coating arrangement employed for the purpose of carrying out the method of this invention. The sample embodiment involves the manufacture of a metallization layer consisting of tantalum disilicide (TaSi$_2$).

DESCRIPTION OF THE PREFERRED EMBODIMENTS

In the Figure, the silane used for the manufacture of the high melting tantalum silicide layer having a tantalum concentration, for example, of 33 to 36 mole fraction is supplied by means of a mass flow controller 1 and the hydrogen which is employed as a carrier gas for the tantalum pentachloride is supplied by means of a mass flow controller 11 to a reaction chamber 4. The carrier gas can be hydrogen or a mixture of hydrogen with an inert gas such as argon. The tantalum pentachloride is vaporized in a thermostatically controlled chamber 2 and mixed with the hydrogen. The reaction gas mixture consisting of a mixture of about 10 to 25 sccm parts by volume hydrogen and 20 sccm parts by volume silane and a tantalum pentachloride partial pressure of about 0.05 mbar in the chamber 2 is introduced at the location identified at reference numeral 10 by means of the arrow into the reactor 4 which is surrounded by a three-zone furnace 14. The reactor is previously evacuated to a pressure of less than $10^{-4}$ mbar and the substrate holder 13 on which the substrates 3 are located, has been heated by the heating zones 14 to a temperature of 650° C. The evacuation of the reactor 4 proceeds by means of a roughing pump identified at reference numeral 8 and subsequently with a turbomolecular pump identified at reference numeral 7. The turbomolecular pump 7 at a reaction gas pressure of more than $3\times 10^{-2}$ mbar may itself be operated in a lower pressure range. This is achieved by virtue of the fact that the pump is oversized with regard to the suction power (minimum suction power 500 l/s), so that by means of a cross-sectional constriction or narrowing in the direction of the reaction chamber 4 through a throttle valve 6, the necessary pressure gradient results. With a pressure of $4\times 10^{-2}$ mbar in the reaction space 4, a pressure of less than $1\times 10^{-3}$ mbar can then be provided in the turbomolecular pump 7.

The turbomolecular pump 7 must be protected against corrosion as, for example, by rinsing of the bearings with nitrogen as indicated by the inlet arrow 12 and through the use of a corrosion-protected rotor.

Reference numerals 5 and 15 designate shut-off valves while reference numeral 9 indicates a discharge outlet in which the residual gases, for example, hydrogen and hydrogen chloride, are drawn off.

The substrates 3 to be coated consist of silicon crystal substrates provided with circuit structures. The heating of the substrates 3 is controlled through thermocouples not specifically illustrated in the drawing. The pressure in the reactor 4 is kept at about $4\times 10^{-2}$ mbar during the deposition. With a substrate temperature of 650° C., the growth rate of the tantalum disilicide layer, which is formed according to reaction (6) amounts to about 5 to 10 nm/min.

It will thus be seen that the present invention provides a readily controllable means for depositing silicide layers on silicon substrates, and securing good step coverage. It should also be evident that various modifications can be made to the described embodiments without departing from the scope of the present invention.

We claim as our invention:

1. A method for the deposition of a silicide layer of a high melting metal onto a substrate of silicon and/or silicon dioxide which comprises:
    pyrolytically decomposing gases including a decomposable silicon containing hydrogen compound, or a halogenated silane, and a metal halide to form a reaction mixture in a reaction zone,
    depositing a metal silicide from said reaction mixture from the gas phase at reduced pressure, and
    during the decomposition of the gases and deposition of the metal silicide, maintaining the gas pressure in the reaction zone in the range between $1.3\times 10^{-3}$ to $5\times 10^{-2}$ mbar by means of a turbomolecular pump.

2. A method according to claim 1 wherein said gas pressure is maintained in the range between $2\times 10^{-3}$ and $4\times 10^{-2}$ mbar.

3. Use of the method of claim 1 for the manufacture of disilicide layers of tantalum, titanium, tungsten, molybdenum, or niobium as metallization layers for integrated semiconductor circuits.

4. A method according to claim 1 which includes the step of:
    rinsing the bearings of said turbomolecular pump with an inert gas during pumping and utilizing a corrosion-protected rotor.

5. A method according to claim 1 which includes the step of:
    conducting said decomposition and deposition at a pressure in excess of $3\times 10^{-2}$ mbar and throttling the suction power of said turbomolecular pump while operating at such pressure to generate the necessary pressure gradient.

6. A method according to claim 1 wherein said silicon compound is silicochloroform (SiHCl$_3$) or silicon tetrachloride (SiCl$_4$) and supplying to said reaction zone plasma-activated atomic hydrogen.

7. A method according to claim 1 wherein said metal halide is transported into said reaction zone by means of hydrogen or a hydrogen-containing gas.

8. A method according to claim 7 wherein said hydrogen-containing gas is a mixture of hydrogen and an inert gas.

9. A method according to claim 1 wherein said metal halide is tantalum pentachloride.

* * * * *